US006851552B1

(12) United States Patent
Chao

(10) Patent No.: US 6,851,552 B1
(45) Date of Patent: Feb. 8, 2005

(54) CONTAINERS WITH ADDITIONAL FUNCTIONALITY

(75) Inventor: David Chao, Los Altos, CA (US)

(73) Assignee: Contour Optik, Inc., Chiayi (TW)

( * ) Notice: Subject to any disclaimer, the term of this patent is extended or adjusted under 35 U.S.C. 154(b) by 0 days.

(21) Appl. No.: 10/037,687

(22) Filed: Jan. 3, 2002

Related U.S. Application Data

(63) Continuation-in-part of application No. 10/002,253, filed on Nov. 2, 2001.

(51) Int. Cl.[7] .............................................. A45C 11/04
(52) U.S. Cl. .............................. 206/5; 206/320; 463/47; D21/329
(58) Field of Search ................................ 206/5, 6, 320; 273/148 B; 463/46, 47, 48; D21/329, 330, 333, 334

(56) References Cited

U.S. PATENT DOCUMENTS

| | | | |
|---|---|---|---|
| 4,140,140 A | | 2/1979 | Proia et al. |
| 4,230,224 A | | 10/1980 | Weeks |
| 4,320,838 A | * | 3/1982 | Braver ........................ 206/564 |
| 4,384,645 A | | 5/1983 | Manfredi |
| 4,478,330 A | * | 10/1984 | Lin ............................... 206/38 |
| D336,665 S | * | 6/1993 | Tugendhaft ................. D21/329 |
| 5,560,476 A | * | 10/1996 | Lee ............................... 206/38 |
| 5,605,226 A | | 2/1997 | Hernlein |
| 5,706,975 A | | 1/1998 | Cronk |
| 5,918,734 A | | 7/1999 | Devens et al. |
| 5,929,967 A | | 7/1999 | Conner |
| 6,145,986 A | * | 11/2000 | Conner ........................ 351/158 |
| D435,869 S | * | 1/2001 | Podd et al. ................. D21/329 |
| 6,170,108 B1 | | 1/2001 | Knight |
| 6,247,477 B1 | | 6/2001 | Wagner |
| 6,286,667 B1 | * | 9/2001 | Lee ............................... 206/38 |
| 6,357,641 B1 | | 3/2002 | Cheng |
| 6,463,936 B1 | | 10/2002 | Hicks |

* cited by examiner

*Primary Examiner*—Jila M. Mohandesi
(74) *Attorney, Agent, or Firm*—Greenberg Traurig, LLP

(57) ABSTRACT

The present invention is directed to multipurpose containers in which a variety of items can be stored, such as eyeglasses writing instruments, pills, medicines, thermometers, rulers, note pads, to name a few of the nearly limitless number of items that can be stored. The containers are provided with lighters, video game players, and currency converters.

3 Claims, 11 Drawing Sheets

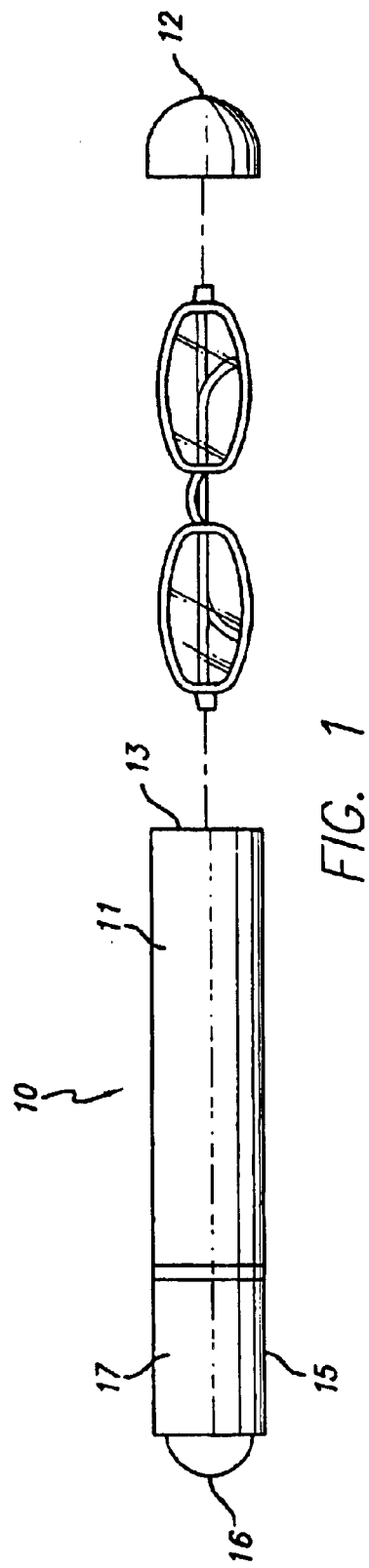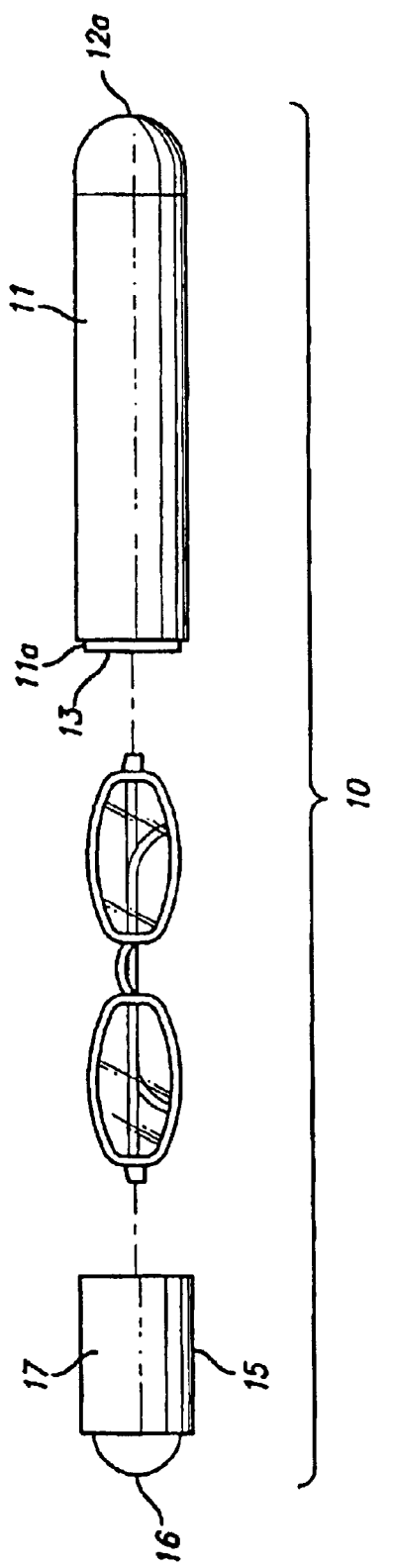

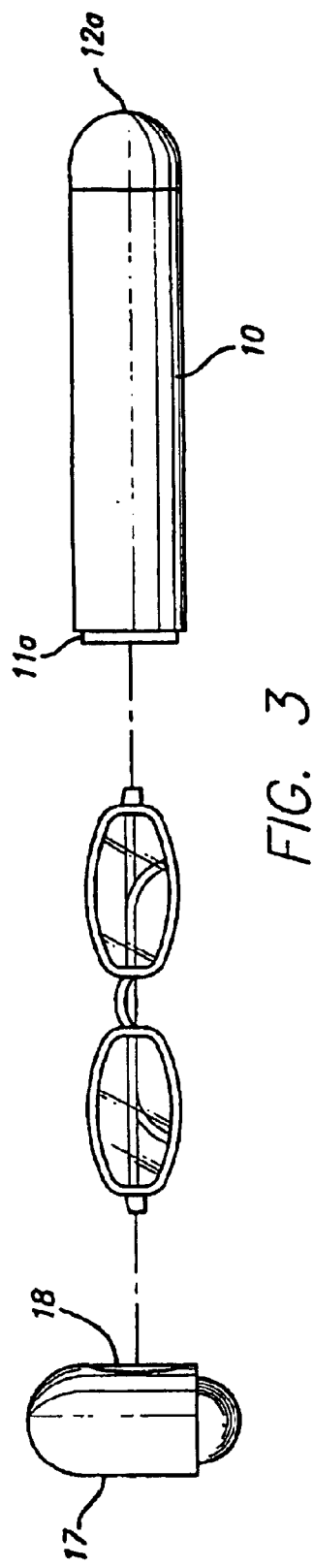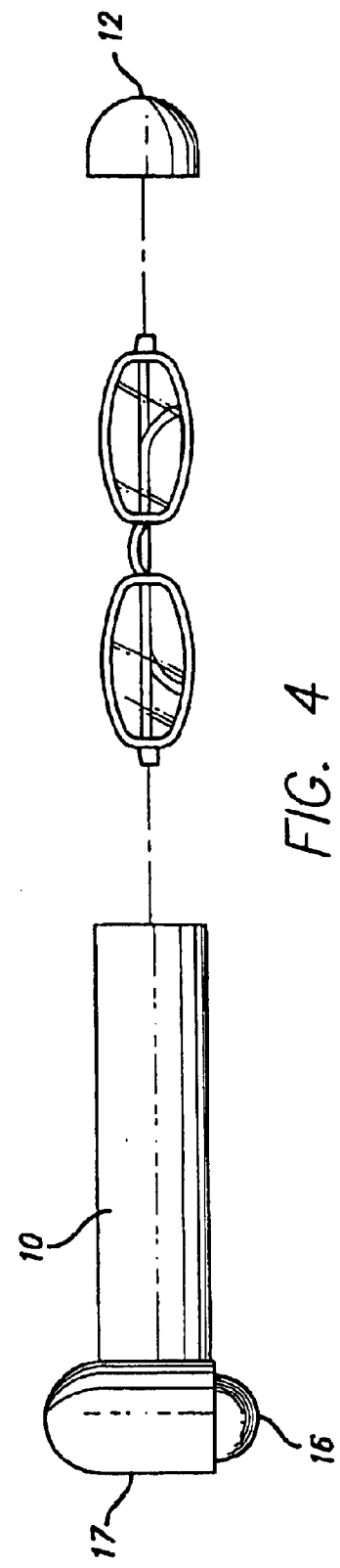

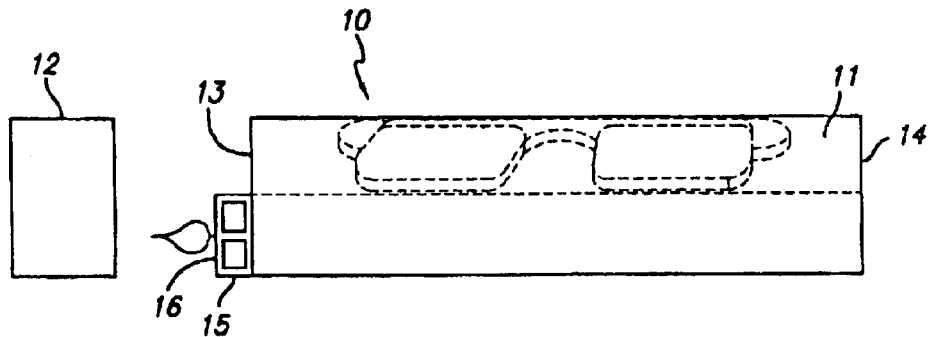
FIG. 23
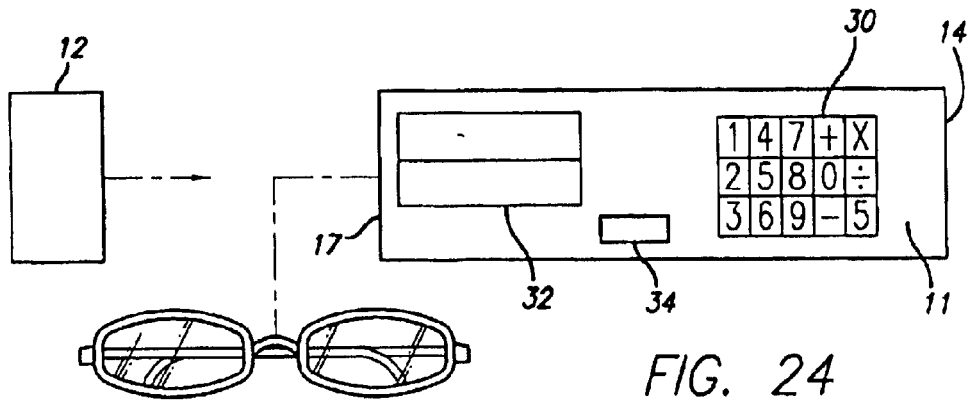
FIG. 24
FIG. 25
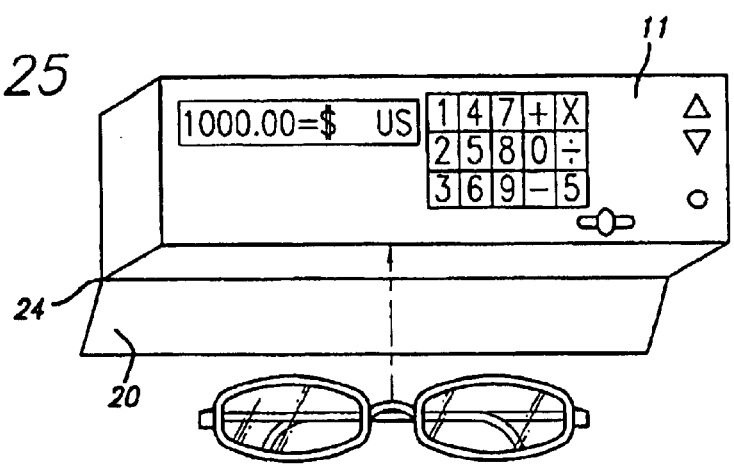

CONTAINERS WITH ADDITIONAL FUNCTIONALITY

RELATED APPLICATION

This application is a Continuation-in-Part of U.S. Ser. No. 10/002,253, filed Nov. 2, 2001 pending.

FIELD OF THE INVENTION

The present invention is directed to multipurpose containers in which a variety of items can be stored, such as eyeglasses writing instruments, pills, medicines, thermometers, rulers, note pads, to name a few of the nearly limitless number of items that can be stored. The containers may be provided with an item of additional functionality, such as a massage element, a fan, a calculator, personal digital assistant, a radio, an MP3 player, to name a few possibilities.

BACKGROUND OF THE INVENTION

There are numerous containers in the prior art that can be used to store items, that may or may not have another purpose associated with it, such as an attached writing instrument, or storing another item, or providing information on a prevailing aspect of the moment, such as temperature or time.

SUMMARY OF THE INVENTION

The present invention is directed to multipurpose containers and that can be used to store and retain a variety of items, including such items as eyeglasses, medicines, foods, rulers, thermometers, note pads, to name but a few of the possibilities. The containers have an interior space for storing an item. Further, the containers are provided with an item that provides an additional functionality to the container. Those items include massage elements, personal digital assistants ("PDA's"), radios, MP3 players and other digital music systems, calculators, utility storage devices (like Swiss army knives), fans, currency converters, a lighter, video gaming device.

While the detailed description relates to a container for eyeglasses, it is immediately apparent that other items can be stored in the containers as well.

BRIEF DESCRIPTION OF THE DRAWINGS

FIG. 1 is a side elevational view of a container provided with a massage element FIGS. 2–6 are side elevational views of additional embodiments of containers provided with a massage elements.

FIG. 23 is a side elevational view of an alternative embodiment of a lighter and container.

FIG. 24 is a side elevational view of a currency converter and container of the present invention.

FIG. 25 is an alternative embodiment of a side elevational view of a currency converter and container of the present invention.

DETAILED DESCRIPTION OF THE PREFERRED EMBODIMENT

Figure 5:
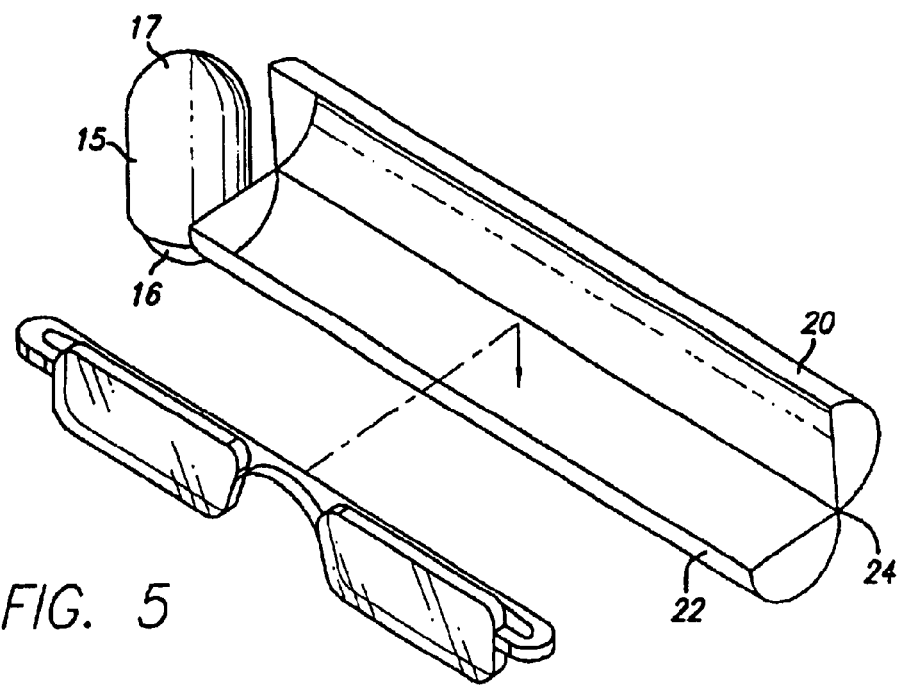

FIG. 1 shows a container 10 for storing eyeglasses or other items. The container 10 is provided with a body 11 defining a cavity in which an item such as eyeglasses can be stored. The container is provided with a cap 12 dimensioned to close the opening 13 of the body 11, through which opening 13 the eyeglasses are inserted into the cavity. When the cap 12 is joined to the body 11, the interior space is enclosed. When the cap is removed from the body, the interior space can be accessed, permitting the user to insert or remove the eyeglasses from the space.

The container is further provided with a massage element 15 at its other end. The massage element has a spherical tip suited to providing a pleasing or therapeutic effect to parts of a person's body. The massage effect can be provided manually, or it can be provided mechanically. One such manner of providing the effect mechanically can be provided by placing a vibrator within the housing 17, which can hold a battery (not shown) for powering the vibrator.

In an alternative embodiment depicted in FIG. 2, the container opens between the housing 15 and body 11. Body 11 can be provided with rim 11a that fits within the interior wall of the housing 15 and forms a frictional fit therewith. In yet a further alternative embodiment shown in FIG. 3, the housing is provided with a recess or opening 18 on one of its sides for receiving the body 11. This positions the massage element perpendicular to the longitudinal axis of the body 11. FIG. 4 shows an embodiment where the opening 13, and cap 12, which seals the opening, is positioned at the end opposite the massage element 15.

Figure 6:
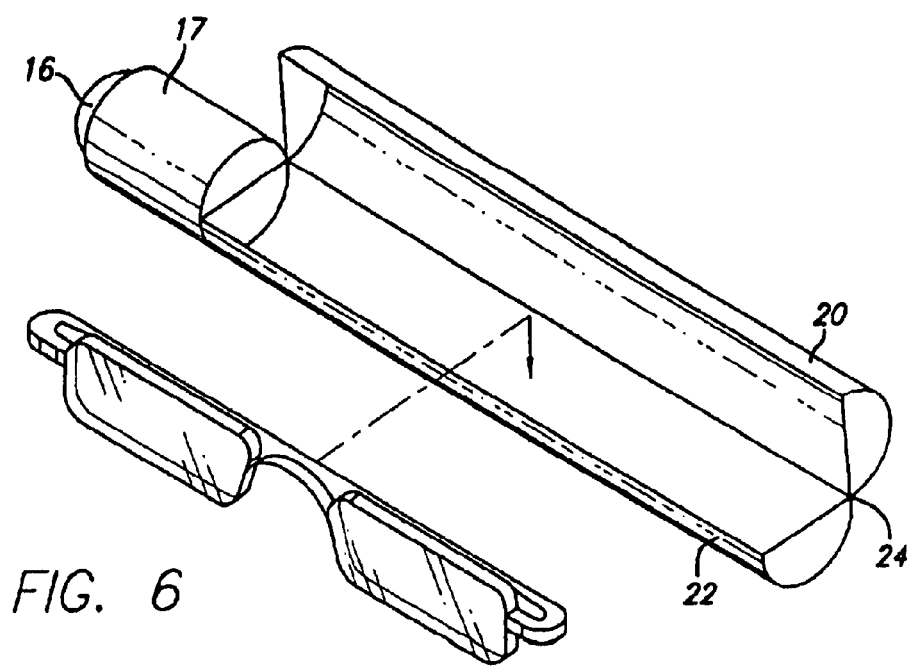

FIG. 5 shows an alternative arrangement in which the massage element 15 is mounted to a clamshell type eyeglass case. The clamshell-type eyeglass case is provided with an upper portion 20, and a lower portion 22 each of which are joined to each other by a hinge 24. FIG. 6 shows a claimshell type arrangement for the case wherein the massage head is parallel to the longitudinal axis of the body.

Figure 7:
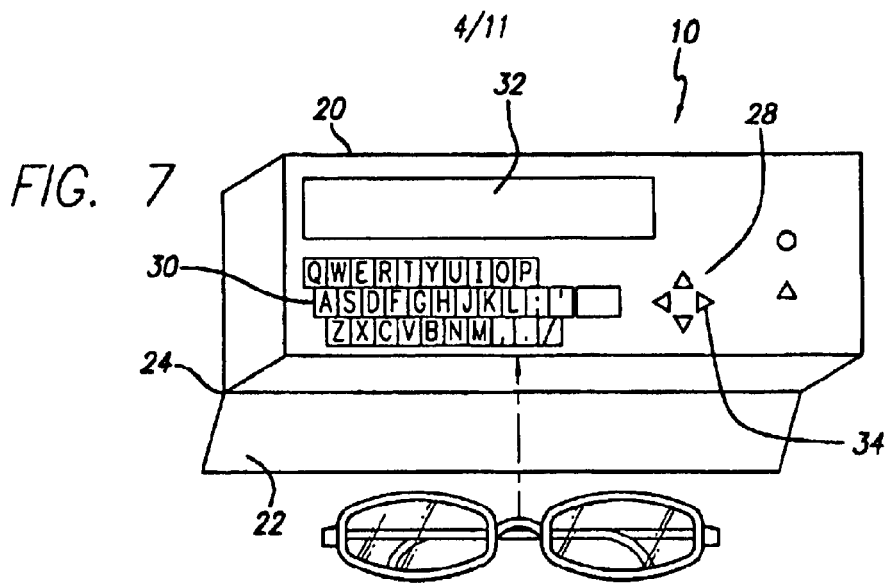
FIG. 7 is a side elevational view of a personal digital assistant (PDA) and container of the present invention.
Figure 8:
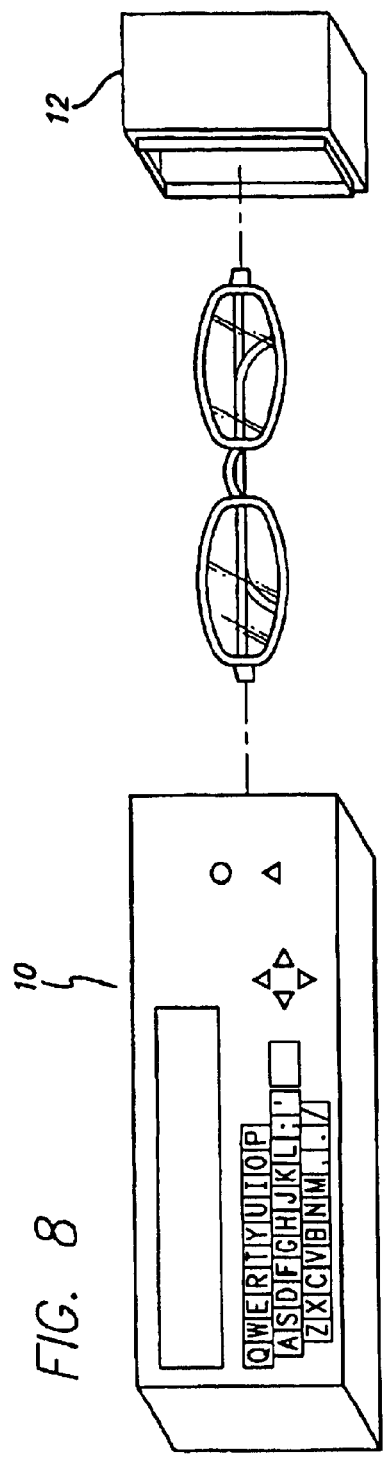
FIG. 8 is a side elevational view of an alternative embodiment of a personal digital assistant and container.

FIG. 7 shows a container for storing eyeglasses having a PDA device (Personal Digital Assistant) 28 located on the container. In the embodiment shown, the container 10 is provided with a portion 22 that is attached to the body 20 by a hinge 24. The PDA is provided with a keyboard 30, display 32, and functionality keys 34. The portion 22 can be opened and closed in order to provide access to the interior of the container. In another arrangement shown in FIG. 8, the container can be provided with an opening in at least one end. A cap or other closure 12 can then be placed over the opening, or removed therefrom, to provide access to the interior of the container.

Figure 9:
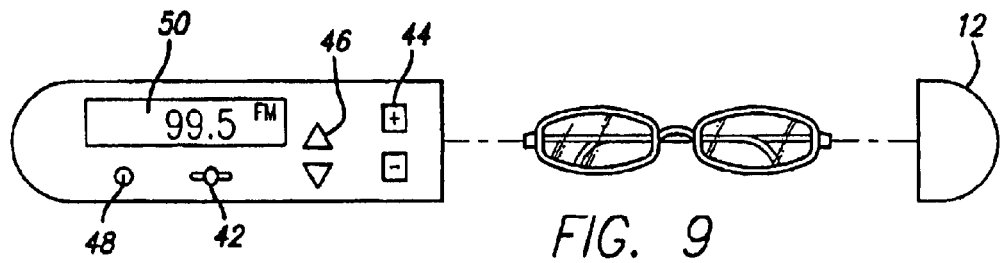
FIG. 9 is a side elevational view of a radio and container of the present invention.
Figure 10:
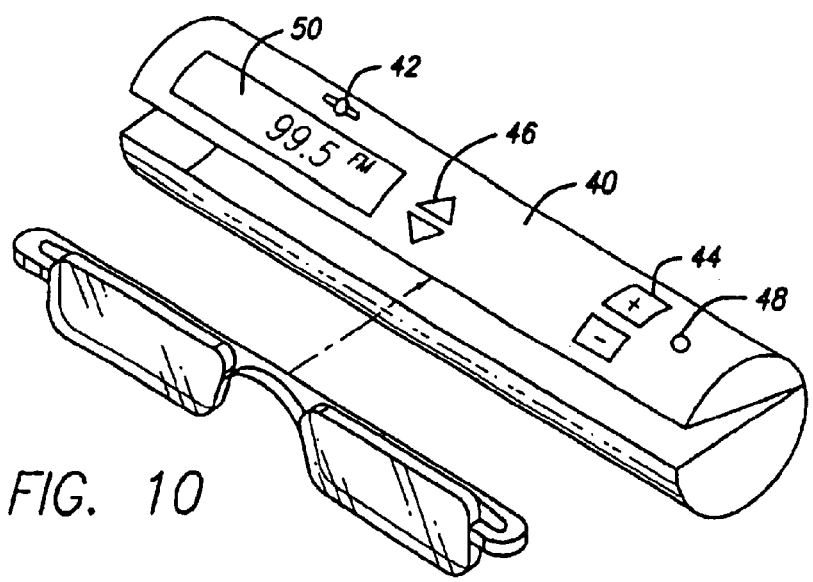
FIG. 10 is a side elevational view of an alternative embodiment of a radio and container of the present invention.

FIG. 9 shows a container on which a radio 40 is positioned on the container 10. The radio is provided with the standard controls: an on-off switch 42, a tuner control 44, a volume control 46, band selection, and a tuner display. FIG. 9 shows the container provided with a container body which has an opening at one end through which a the glasses can be inserted and removed from the container. The cap 12 can be placed over the container in order to seal the interior of the container from the outside environment, or, as the case may be, removed to provide access to the interior of the container. FIG. 10 shows a container in a clam-shell arrangement in which a radio is positioned on the container.

Figure 11:
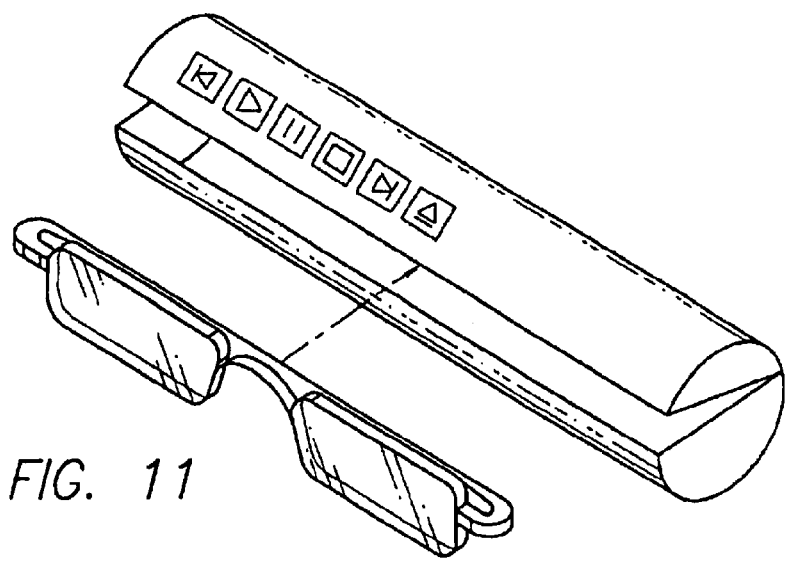
FIG. 11 is a side elevational view of a MP3 device and container of the present invention.
Figure 12:
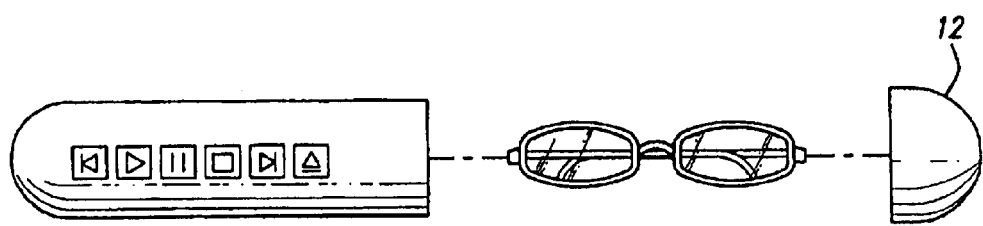
FIG. 12 is a side elevational view of an alternative embodiment of a MP3 device and container of the present invention.

FIG. 11 shows a portable MP3 player in which is positioned on the container 10 is in a clam shell type arrangement. The MP3 player is provided with the conventional controls, including ones that permit track selection, fast forward, rewind, skip forward, skip backward, erase, upload, download, on and off, and volume. The device is also provided with ports that can be used to interface the device to a source from which MP3's can be transferred, either to or from the MP3 device. FIG. 12 shows the container provided with a container body which has an opening at one end through which a the glasses can be inserted and removed from the container. The cap can be placed over the container in order to seal the interior of the container from the outside environment, or, as the case may be, removed to provide access to the interior of the container.

Figure 14:
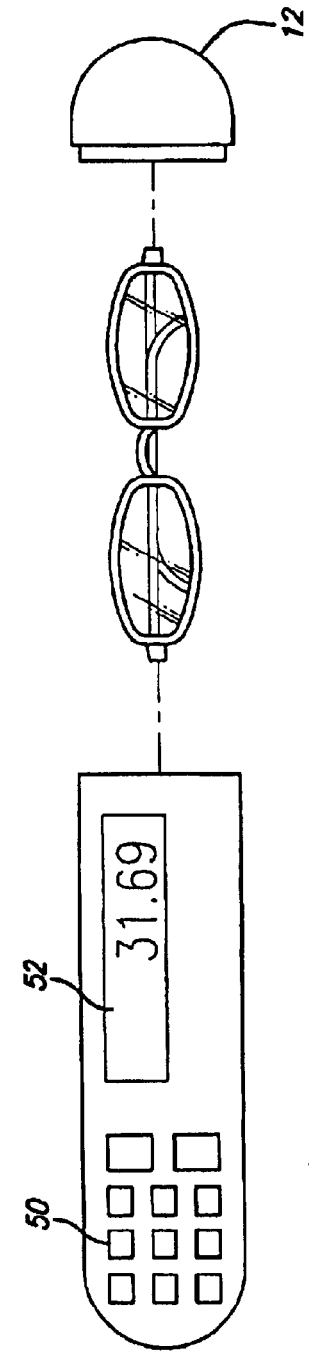
FIG. 14 is a side elevational view of an alternative embodiment of a calculator and container of the present invention.
Figure 13:
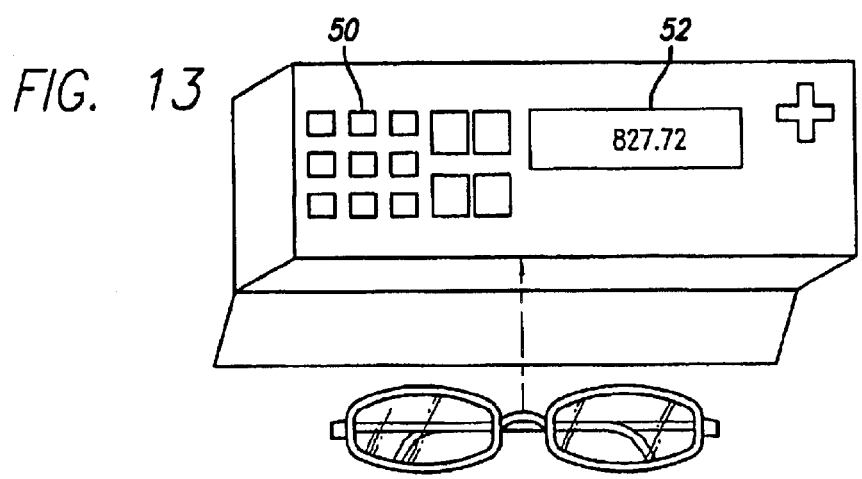
FIG. 13 is a side elevational view of a calculator and container of the present invention.

FIG. 13 shows a calculator which is positioned on the container that is provided with a clam shell type arrangement. The calculator is provided with the conventional controls, including ones that buttons for digits, mathematical functions, clear, and on/off. It is also provided with a numeric display 52. FIG. 14 shows the container provided with a container body which has an opening at one end through which a the glasses can be inserted and removed from the container. The cap 12 can be placed over the container in order to seal the interior of the container from the outside environment, or, as the case may be, removed to provide access to the interior of the container.

Figure 15:
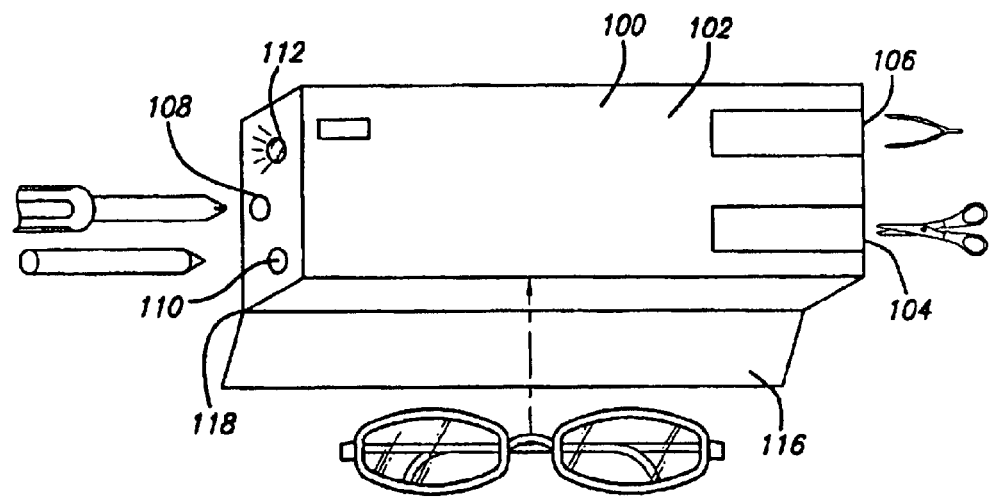
FIG. 15 is a side elevational view of a utility storage device and container of the present invention.
Figure 16:
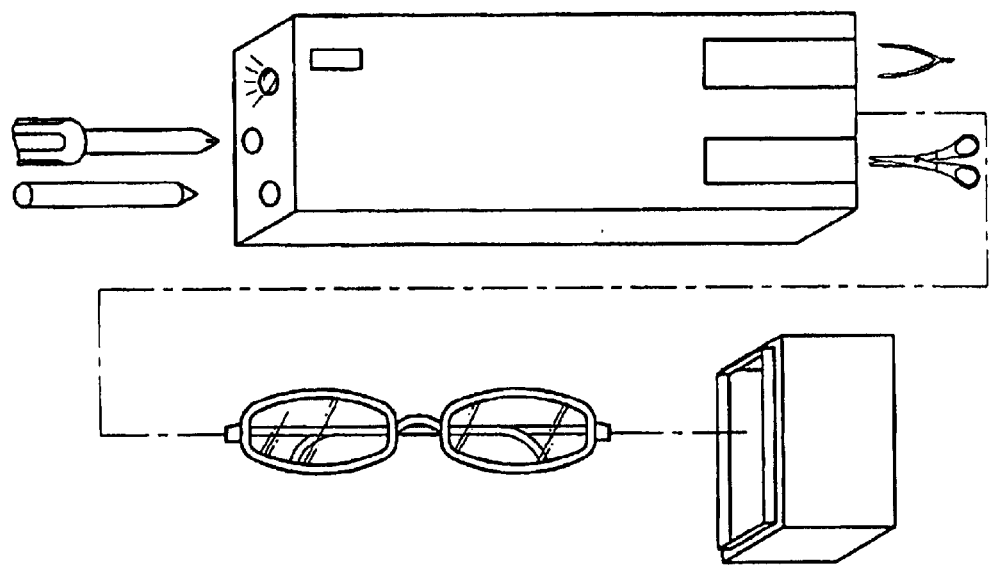
FIG. 16 is a side elevational view of an alternative embodiment of a utility storage device and container of the present invention.

FIG. 15 shows a utility type device 100 which provides a container having a body 102 for storing eyeglasses in an interior portion, and other compartments 104, 106, 108 110, for holding any of a number of useful items, such as scissors, tweezers, a screw driver, and a pen. The container may also be provided with a flashlight 112 having a light source, an on/off switch 114, and a recess for a power supply, such as a battery. A sidewall portion 116 is joined to the body 102 by a hinge 118. The sidewall can be opened and closes along the hinge. FIG. 16 shows an embodiment in which the container is open and closed with a cap as in every other even numbered embodiment.

Figure 17:
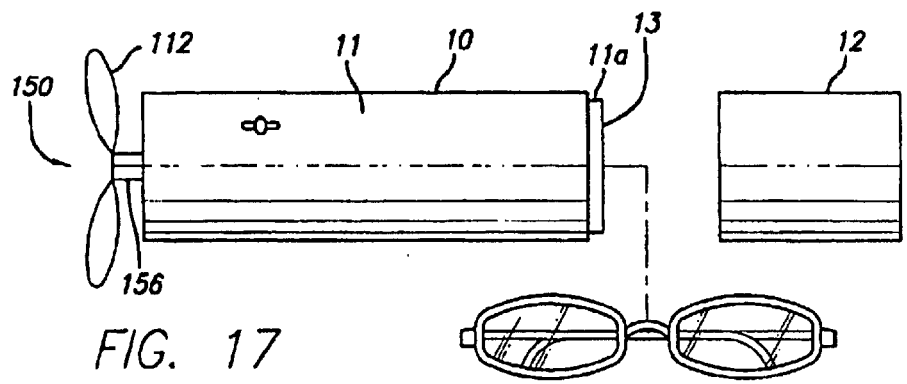
FIG. 17 is a side elevational view of fan and container of the present invention.

FIG. 17 shows a container 10 for storing eyeglasses or other items. The container 10 is provided with a body 11 defining a cavity in which an item such as eyeglasses can be stored. The container is provided with a cap 12 dimensioned to close the opening 13 of the body 11, through which opening 13 the eyeglasses are inserted into the cavity. When the cap 12 is joined to the body 11, the interior space is enclosed. When the cap is removed from the body, the interior space can be accessed, permitting the user to insert or remove the eyeglasses from the space.

The container is further provided with a fan 150 at its other end. The fan 150 has a propeller 152 joined to the body 11 by axial pin 156. The body 11 contains a power source (not shown), such as a battery (not shown), that powers a motor that rotates the axial pin 156. Switch 158 turns the motor on and off.

Figure 18:
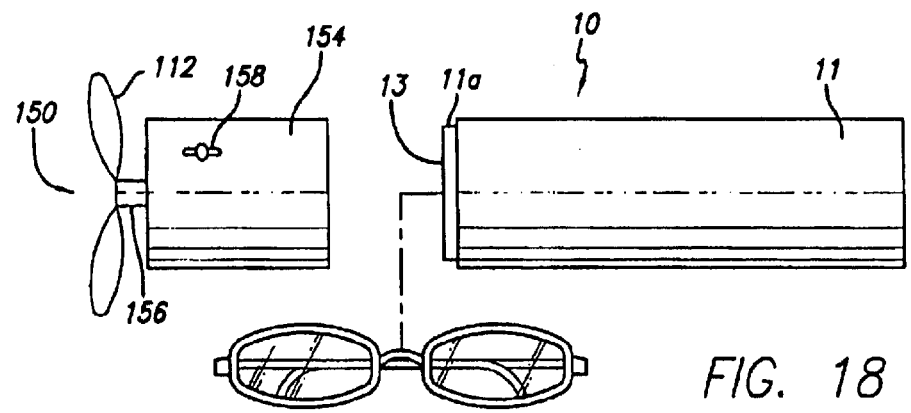
FIG. 18 is a side elevational view of an alternative embodiment of a fan and container of the present invention.
Figure 19:
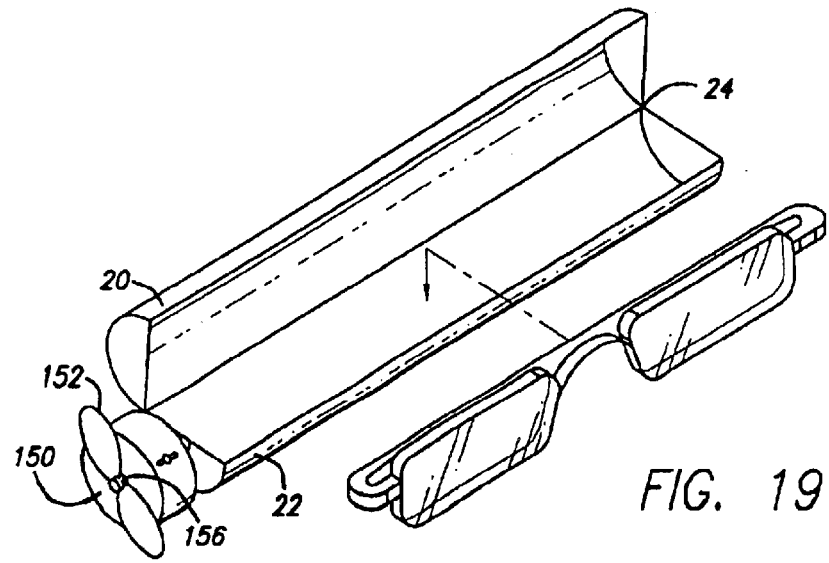
FIG. 19 is a side elevational view of an alternative embodiment of the present invention.

In an alternative embodiment depicted in FIG. 18, the container opens between the housing 154 and body 11. Body 11 can be provided with rim 11a that fits within the interior wall of the housing 154 and forms a frictional fit therewith. FIG. 19 shows an alternative arrangement in which the fan 150 is mounted to a clamshell type eyeglass case. The clamshell-type eyeglass case is provided with an upper portion 20, and a lower portion 22 each of which are joined to each other by a hinge 24.

Figure 20:
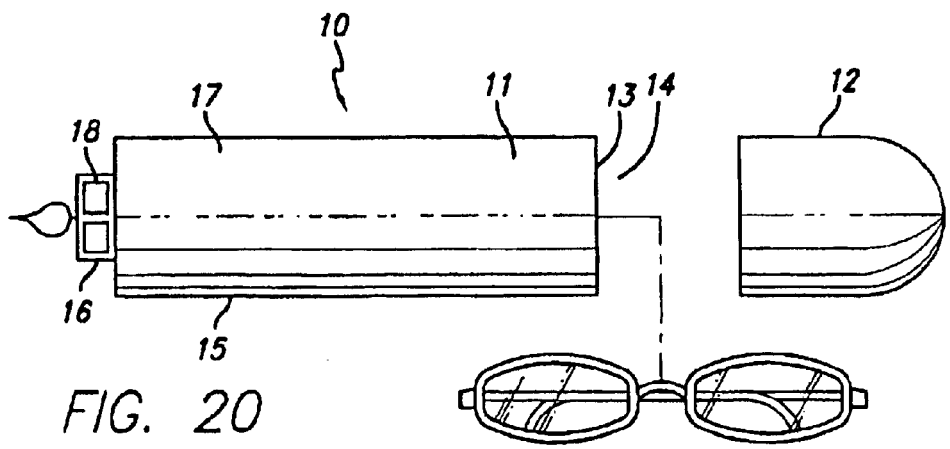
FIG. 20 is a side elevational view of a lighter and container of the present invention.

FIG. 20 shows a container 10 for storing eyeglasses or other items. The container 10 is provided with a body 11 defining a cavity that serves as storage space where an item such as eyeglasses can be stored. The container is provided with a cap 12 dimensioned to close the opening 13 of the body 11 positioned at end 14, through which opening 13 the eyeglasses are inserted into the cavity. When the cap 12 is joined to the body 11, the interior space is enclosed. When the cap 12 is removed from the body, the interior space can be accessed, permitting the user to insert or remove the eyeglasses from the space.

The container is further provided with a lighter 16 at its other end 17. The lighter 16 is provided with a housing 18, and a flint 19, such as a flint mounted on a wheel 18a, and a surface positioned to engage the wheel in frictional contact when the wheel is rotated. When the flinted portion of the wheel and the surface contact each other and the wheel is moved, sparks are formed. When wheel 18a is rotated while the button 20 is depressed, a flow of butane or other combustible fluid is released, thereby producing a flame. The flame has a burns for a length of the time that the button is depressed. The fluid can be stored in a cavity (not shown) that is positioned under the housing 18.

Figure 21:
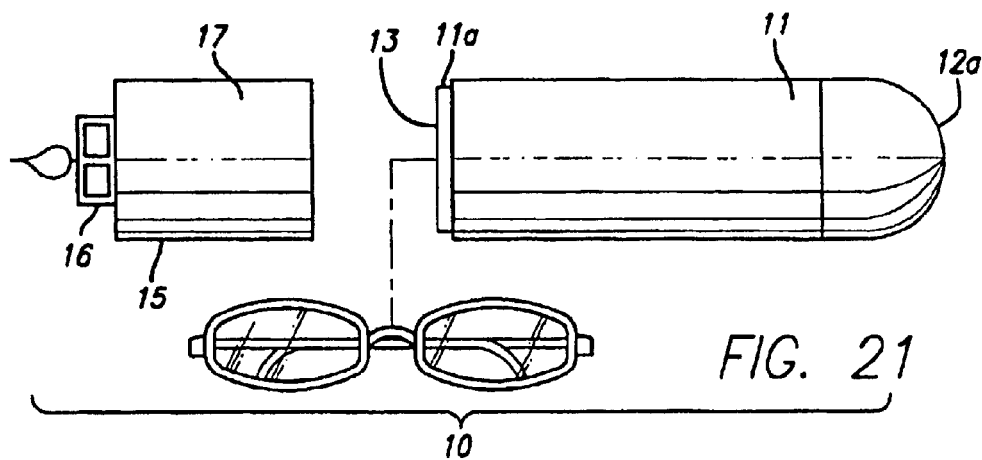
FIG. 21 is a side elevational view of an alternative embodiment of a lighter and container.

In an alternative embodiment depicted in FIG. 21, the container opens between the end portion 15 and body 11. Body 11 can be provided with rim 11a that fits within the interior wall of the end portion 15 and forms a frictional fit therewith.

Figure 22:
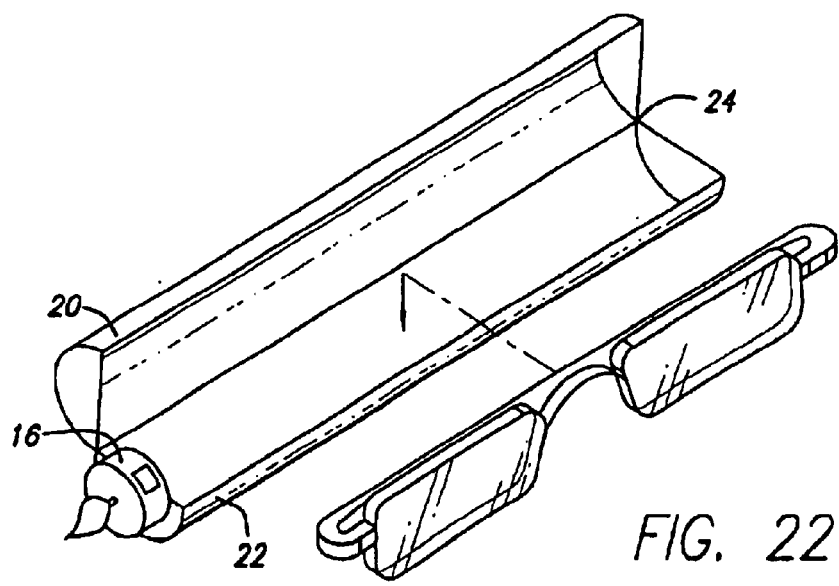
FIG. 22 is a side elevational view of an alternative embodiment of a lighter and container.

FIG. 22 shows an alternative arrangement in which the lighter 16 is mounted to a clamshell type eyeglass case. The clamshell-type eyeglass case is provided with an upper portion 20, and a lower portion 22 each of which are joined to each other by a hinge 24.

FIG. 23 shows an alternative embodiment in which the first end 14 is closed and the opening is provided at the other end 17 where lighter 16 is positioned. Thus the glasses are removed or inserted though the same end 16 where the lighter is located.

FIG. 24 shows a container for a pair of eyeglasses that is provided with a currency converter. The container is provided with a body 11 defining a cavity having first and second ends 14 and 17, one of which is closed and the other of which is open. As shown in the Figure, first end 14 is closed and second end 17 is open, though it should be understood that the opening could be placed at the first end 14. The second end 17 can be closed with a cap 12, which when removed from the container provides access to the cavity where glasses or other items can be stored.

The container 11 is provided with a keypad 30 for entering the information necessary to carry out a currency conversion operation. The container is further provided with a display 32, such as a liquid crystal display, in order to display information. The converter is provided with a CPU, memory and storage and a power supply (such as a battery) in order to carry out the currency conversions. In addition to being provided with keys necessary to enter numbers and decimal points, the keypad may optionally be provided with buttons to scroll up and down information displayed on the screen (such as for example, units of currency). Optionally, the converter and be provided with keys to enter particular units of currency. The converter may also be provided with an enter button, to signify that all data, or data pertaining to a particular step, has been entered. Also, the converter may be provided with a data port 34, such as a USB port so that current exchange rates can be downloaded to the storage device on the converter.

Figure 26:
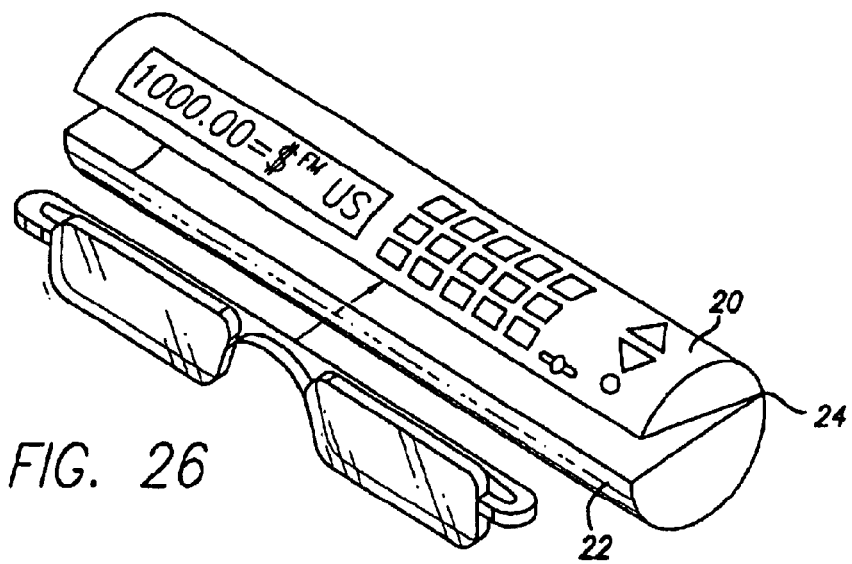
FIG. 26 is an alternative embodiment of a side elevational view of a currency converter and container of the present invention.

FIGS. 25 and 26 show alternative embodiments of the currency converter in which the container is provided with a door or flap 20 that is mounted to the body 11 by a hinge 24. When the door is open the glasses or other items can be inserted through the opening into the cavity, and the door can then be shut. FIG. 26 shows a currency converter located on a container in a clam shell type arrangement that is similar to the one shown in FIG. 22.

Figure 27:
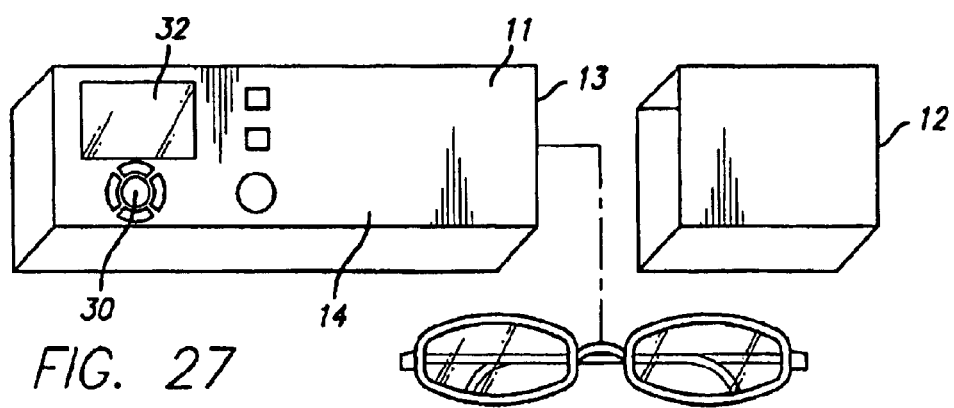
FIG. 27 is a side elevational view of a video gaming device and container of the present invention.

FIG. 27 shows a container for storing eyeglasses having a video game device 28 located on the container. The device is provided with a display 32 and keypad 30 with the individual keys necessary to operate the device, such as a set of keys arrayed around the perimeter of a larger key pad. The device is provided with a CPU, memory, storage and a power supply (such as a battery) in order to carry out the function associated with the game. These keypads can be used to control the movement of a game piece that appears on the screen. In FIG. 27, the container 10 is provided with a body 11 defining a cavity in which an item such as eyeglasses can be stored. The container is its provided with a cap 12 dimensioned to close the opening 13 of the body 11 positioned at end 14, through which opening 13 the eyeglasses are inserted into the cavity. When the cap 12 is joined to the body 11, the interior space is enclosed. When the cap 12 is removed from the body, the interior space can be accessed, permitting the user to insert or remove the eyeglasses from the space.

Figure 28:
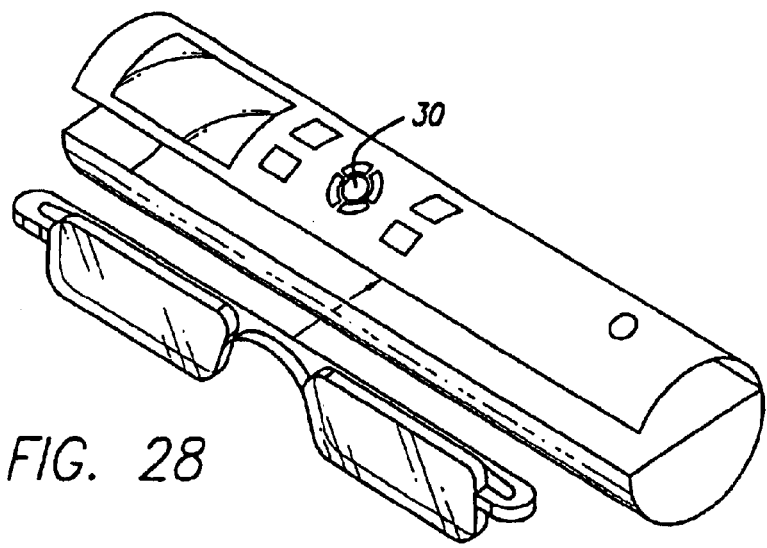
FIG. 28 is an alternative embodiment of a side elevational view of a video gaming device and container of the present invention.

FIG. 28 shows an alternative to the FIG. 27 embodiment wherein a video game device located on a container in clamshell type container as previously described is provided.

I claim:

1. A container for storing an item, which container is comprised of a body defining an interior space for storing the item, an opening through which the item can be stored in the body and removed therefrom, a closure element having an open position permitting access to the interior space and a closed position closing the interior space, and a video gaming device located on the container, wherein the stored item is a pair of eyeglasses.

2. The container of claim 1, wherein the opening is closed with the closure element.

3. A container for storing an item, which container is comprised of a body including a first portion and a second portion, wherein the first portion and the second portion are joined together at a hinge, the first portion and the second portion defining an interior space for storing the item, and a video gang device located on the container, wherein the container has an open state and a closed state such that when the container is in the open state, access to the interior space is permitted, and when the container is in the closed state, the interior space is closed-off, and wherein the stored item is a pair of eyeglasses.

* * * * *